(12) United States Patent
Yeh et al.

(10) Patent No.: US 6,566,160 B2
(45) Date of Patent: May 20, 2003

(54) METHOD OF FORMING A COLOR FILTER

(75) Inventors: Cheng-Pang Yeh, Tainan (TW); Ching-Chung Chen, Hsi-Chih (TW)

(73) Assignee: United Microelectronics Corp., Hsin-Chu (TW)

( * ) Notice: Subject to any disclaimer, the term of this patent is extended or adjusted under 35 U.S.C. 154(b) by 6 days.

(21) Appl. No.: 09/885,044

(22) Filed: Jun. 21, 2001

(65) Prior Publication Data
US 2002/0197763 A1 Dec. 26, 2002

(51) Int. Cl.[7] .................... H01L 21/00; H01L 29/04; G02E 1/1333
(52) U.S. Cl. .................... 438/70; 349/42; 257/59
(58) Field of Search .................... 438/70; 349/42; 257/59

(56) References Cited

U.S. PATENT DOCUMENTS 4,470,667 A * 9/1984 Okubo et al. ............ 280/1.192
6,411,349 B2 * 6/2002 Nakazawa et al. ............ 257/59

* cited by examiner

*Primary Examiner*—William David Coleman
(74) *Attorney, Agent, or Firm*—Winston Hsu

(57) ABSTRACT

The present invention provides a method for increasing adhesion of color filters and preventing cross talk effects on a semiconductor wafer. The method first involves forming a dielectric layer on the semiconductor wafer, which covers each MOS transistor sensor formed on the surface of the semiconductor wafer. Then, a plurality of metal layers are formed on the dielectric layer, each two metal layers positioned approximately above two ends of one MOS transistor sensor. Next, a passivation layer is formed, followed by the formation of a first color filter on the passivation layer. The two ends of the first color filter are aligned approximately above the two metal layers. Thereafter, a second color filter and a third color filter are sequentially formed on the passivation layer, and portions of both the second color filter and the third color filter cover one end of the first color filter. The portions of each color filter covering one other are used to enhance adhesion of the color filters, and simultaneously to function as barriers to prevent cross talk effects.

7 Claims, 6 Drawing Sheets

METHOD OF FORMING A COLOR FILTER

FIELD OF THE INVENTION

The present invention relates to a method of manufacturing color filters, and more particularly, to a method of increasing the adhesion of color filters and preventing cross talk effects on a semiconductor wafer.

DESCRIPTION OF THE PRIOR ART

Charge-coupled device (CCDs) have been the mainstay of conventional imaging circuits for converting light into an electrical signal. The applications of CCDs include monitors, transcription machines and cameras. Although CCDs have many advantages, CCDs also suffer from high costs and the limitations imposed by its volume. To overcome the weakness of CCDs and reduce costs and dimensions, a CMOS photodiode device is developed. Since a CMOS photodiode device can be produced by using conventional techniques, both cost and the volume of the sensor can be reduced. The applications of CMOS photodiodes include PC cameras, digital cameras etc.

Whether the image sensor device is composed of CCD or CMOS photodiode, the incident light must be separated into a combination of light of different wave lengths, for example, red, blue and green light. Then, the light is received by corresponding sensor devices and is transformed into electrical signals so as to obtain the original color of incident light by return of the electrical signals. Therefore, a color filter array must be formed on each photosensor device. Currently, color filters are produced by either patterning photosensitive resins using a photo-etching process with the resultant patterns being dyed by a dyeing material, or a photoresist containing dyeing material is directly used to produce color filters.

Please refer to FIG. 1 to FIG. 6. FIG. 1 to FIG. 6 are cross-sectional diagrams of manufacturing a color filter array on a photosensor device according to the prior art method. As shown in FIG. 1, the semiconductor wafer 10 contains a silicon substrate 12 and a P-well 14 positioned on the silicon substrate 12. The photosensor device contains a plurality of CMOS photodiodes and each photodiode contains a metal-oxide semiconductor (MOS) transistor (not shown) positioned on the P-well 14. A photosensor area 18 is formed on the P-well 14 to electrically connect with the MOS transistor. The MOS transistor is a complementary metal-oxide semiconductor (CMOS) transistor composed of an NMOS transistor and a PMOS transistor and functions as a CMOS transistor sensor. The semiconductor wafer 10 also contains a plurality of field oxide layers or shallow trench isolation (STI) structures 16 positioned on the silicon substrate 12 that surrounds the photo sensor area 18. The STI structures 16 act as a dielectric insulating material to prevent short circuiting due to contact between the photosensor areas 18 and other units.

First, a passivation layer 20 is formed on the surface of the semiconductor wafer 10 that covers each photo sensor area 18. Next, as shown in FIG. 2, a red color filter layer (not shown) is formed on the surface of the semiconductor wafer 10. The color filter layer is composed of a positive type photoresist containing a red dye in a large amount (dry weight) of 10 to 50 wt %. A pattern-exposure process is used to form patterns of red color filters in the color filter layer, then the exposed portions of the filter layer is removed to form each red color filter 22. For increasing the effect and reliability of color filters, an ultraviolet (UV) light irradiation and heating process is performed after the formation of the red color filters 22. The UV light used has a wavelength of 320 nm or less at a quantity of 20 J/cm$^2$ or less. The heating process is preferably performed in an inert atmosphere, for example, in nitrogen (N2) for suppressing the oxidation of the photoresist material. The starting temperature of the heating process is between a range of 60° C. to 140° C. Then, an average increasing temperature rate used in the heating process is 1.5° C./sec. The end temperature of the heating process is between a range of 160° C. to 220° C.

Next, green and blue color filters are formed by repeating the above-mentioned processes. As shown in FIG. 3, a green color filter layer 24 is formed on the surface of the semiconductor wafer 10. The color filter layer 24 is composed of a positive type photoresist containing a green dye in a large amount (dry weight) of 10 to 50 wt %. As shown in FIG. 4, a pattern-exposure process is used to form patterns of green color filters in the color filter layer 24, then the exposed portions of the filter layer 24 is removed to form each green color filter 26. For increasing the effect and reliability of color filters, a UV light irradiation and heating process is also performed after the formation of green color filters 26. The UV light used has a wavelength of 320 nm or less at a quantity of 20 J/cm$^2$ or less. The heating process is preferably performed in an inert atmosphere, for example, in nitrogen (N2) for suppressing the oxidation of the photoresist material. The starting temperature in heating process is between a range of 60° C. to 140° C. Then, an average increasing temperature rate used in the heating process is 1.5° C./sec. The end temperature of the heating process is between a range of 160° C. to 220° C.

As shown in FIG. 5, a blue color filter layer 28 is formed on the surface of the semiconductor wafer 10. The color filter layer 28 is composed of a positive type photoresist containing a blue dye in a large amount (dry weight) of 10 to 50 wt %. As shown in FIG. 6, a pattern-exposure process is used to form patterns of blue color filters in the color filter layer 28, then the exposed portions of the filter layer 28 is removed to form each blue color filter 30. For increasing the effect and reliability of color filters, a UV light irradiation and heating process is also performed after the formation of the blue color filters 30. The UV light used for irradiation has a wavelength of 320 nm or less at a quantity of 20 J/cm$^2$ or less. The heating process is preferably performed in an inert atmosphere, for example, in nitrogen (N2) for suppressing the oxidation of the photoresist material. The starting temperature of the heating process is between a range of 60° C. to 140° C. Then, an average increasing temperature rate used in the heating process is 1.5° C./sec. The end temperature of the heating process is between a range of 160° C. to 220° C. The color filter array of a photosensor device produced by the prior art method is then completed.

Color filters produced by the prior art method have only the bottom surfaces contacting the passivation layer. Therefore, adhesion is weak and stripping of the color filters easily occurs. Also, a space exists between each color filter, so that scattered light easily penetrates through the space to enter the neighboring photosensor area and result in cross talk effects. The noise signals received by CMOS transistor sensors increase and the sensitivity is reduced.

SUMMARY OF THE INVENTION

It is therefore a primary objective of the present invention to provide a method of manufacturing color filters for increasing adhesion of color filters and preventing stripping of the color filters. A barrier layer is simultaneously formed to prevent incident light from penetrating the space between the color filters to cause cross talk effects.

The present invention provides a method for increasing both the adhesion of color filters and preventing cross talk effects on a semiconductor wafer. The semiconductor wafer comprises a substrate, a plurality of metal-oxide semiconductor (MOS) transistor sensors positioned on the substrate, and a plurality of insulators positioned on the substrate. Each insulator is positioned between two MOS transistor sensors. The method first involves forming a dielectric layer on the semiconductor wafer, which covers each MOS transistor sensor and insulators. Then, a plurality of metal layers are formed on the dielectric layer, each two metal layers positioned approximately above two ends of one MOS transistor sensor. Next, a passivation layer is formed, followed by the formation of a first color filter on the passivation layer and above one MOS transistor sensor. Two ends of the first color filter are aligned approximately above the two metal layers. Thereafter, a second color filter and a third color filter are sequentially formed on the passivation layer, and portions of both the second color filter and the third color filter cover one end of the first color filter. The portion of the second color filter covering the first color filter and the portion of the third color filter covering the first color filter are both used to enhance adhesion of the color filters, and simultaneously, the portion of the second color filter covering the first color filter and the portion of the third color filter covering the first color filter are both used as barriers to prevent cross talk effects.

The color filters produced by the present invention have portions covering one another so as to increase both the contact areas and the adhesion of the color filters. As well, the covered portions of each color filter are used as a barrier layer to prevent cross talk effects.

These and other objectives of the present invention will no doubt become obvious to those of ordinary skill in the art after reading the following detailed description of the preferred embodiment, which is illustrated in the various figures and drawings.

DETAILED DESCRIPTION OF THE PREFERRED EMBODIMENT

Figure 1:
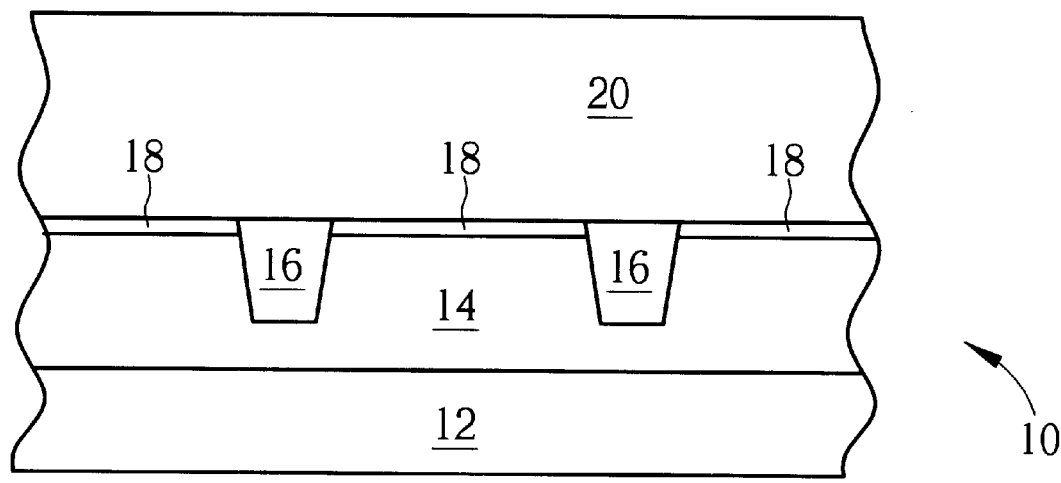
FIG. 1 to FIG. 6 are cross-sectional diagrams of manufacturing a color filter array according to the prior art method.
Figure 2:
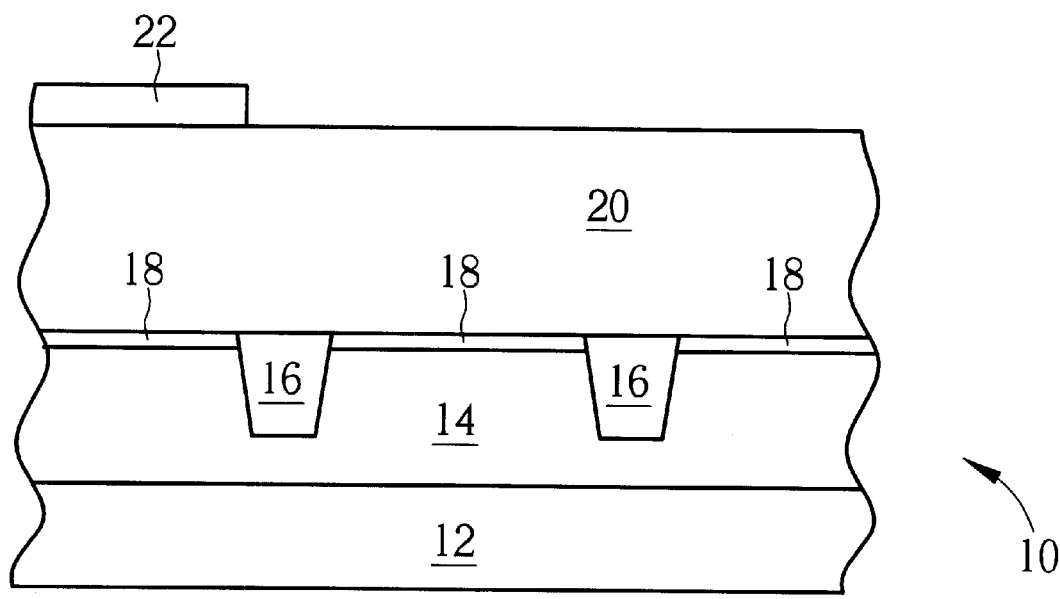
Figure 3:
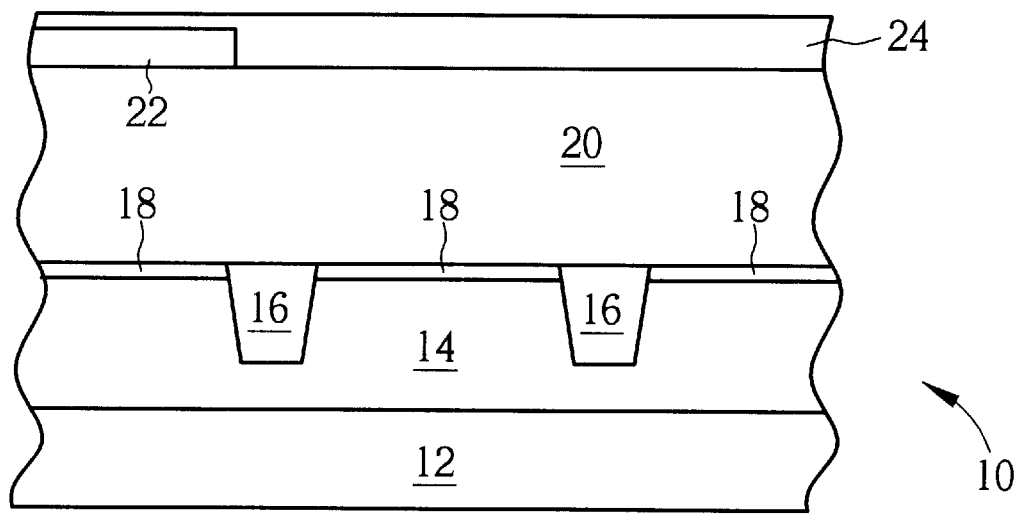
Figure 4:
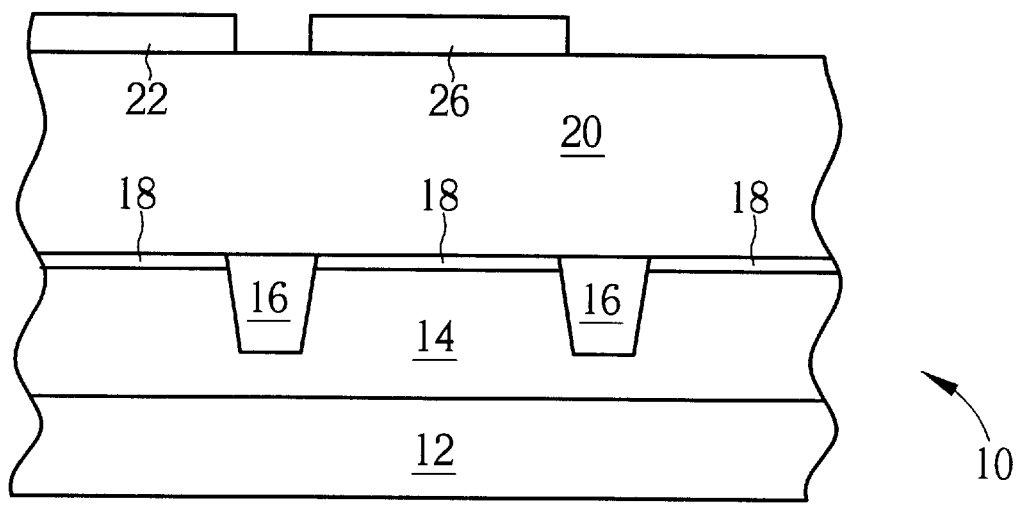
Figure 5:
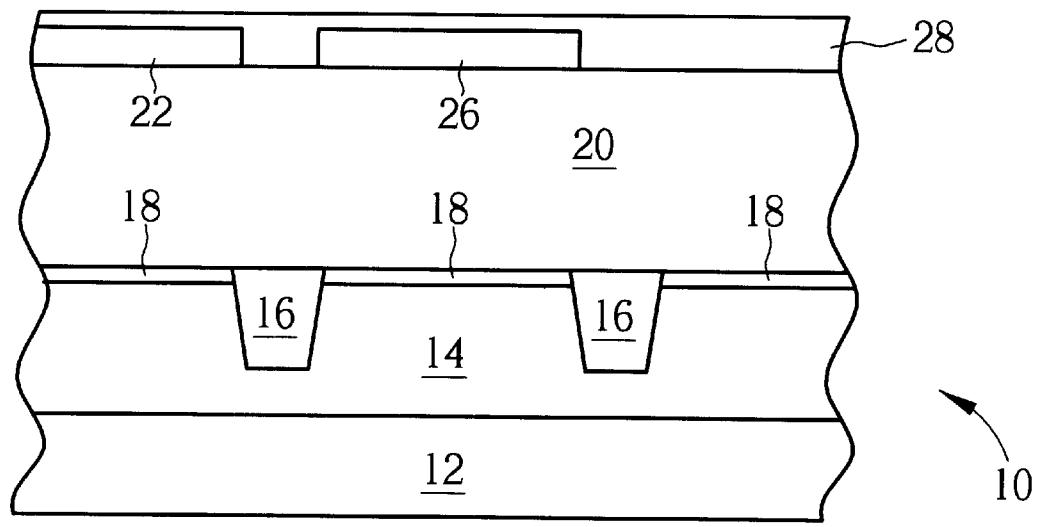
Figure 6:
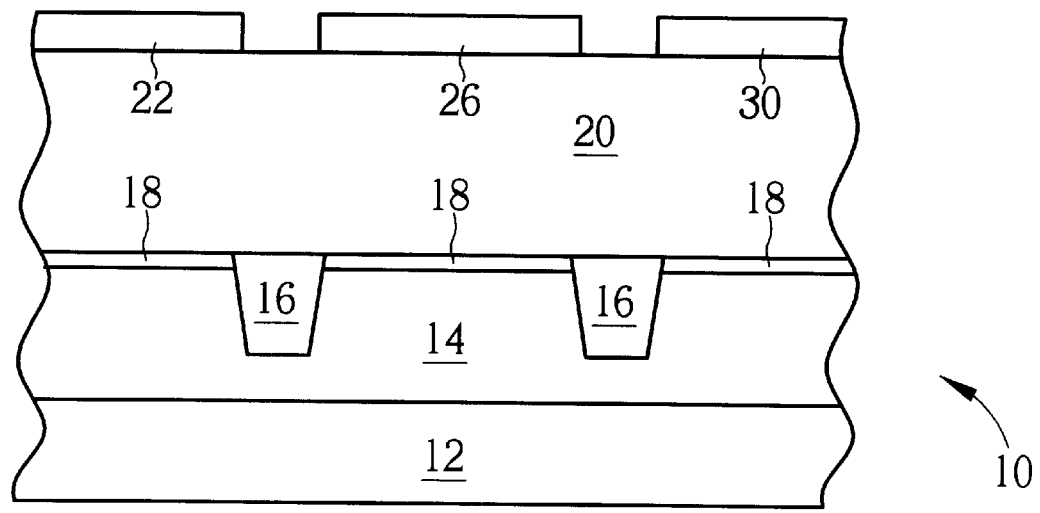
Figure 7:
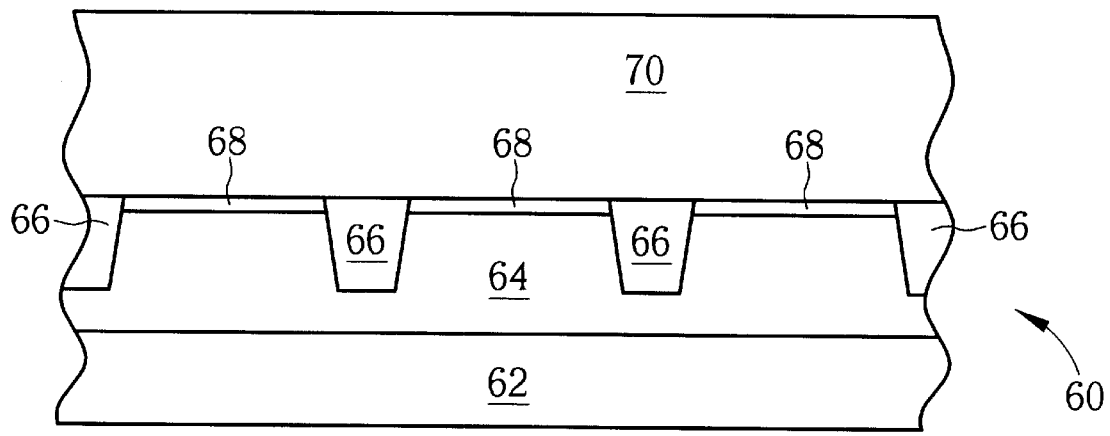
FIG. 7 to FIG. 11 are cross-sectional diagrams of manufacturing a color filter array by the present invention method.

Please refer to FIG. 7 to FIG. 11. FIG. 7 to FIG. 11 are cross-sectional diagrams of manufacturing a color filter array on a photosensor device by the present invention method. As shown in FIG. 7, the semiconductor wafer 60 contains a silicon substrate 62 and a P-well 64 positioned on the silicon substrate 62. The photosensor device contains a plurality of CMOS photodiodes and each photodiode contains a metal-oxide semiconductor (MOS) transistor (not shown) positioned on the P-well 64. A photosensor area 68 is formed on the P-well 64 to electrically connect with the MOS transistor. The MOS transistor is a complementary metal-oxide semiconductor (CMOS) transistor composed of an NMOS transistor and a PMOS transistor and functions as a CMOS transistor sensor. The semiconductor wafer 60 also contains a plurality of field oxide layers or shallow trench isolation (STI) structures 66 positioned on the silicon substrate 62 that surrounds the photosensor area 68. The STI structures 66 act as a dielectric insulating material to prevent short circuiting due to contact between the photosensor areas 68 and other units. Firstly, a dielectric layer 70, composed of silicon-rich oxide (SRO) or spin-on glass (SOG), is formed on the surface of the semiconductor wafer 60, covering each photosensor area 68 and MOS transistor.

Figure 8:
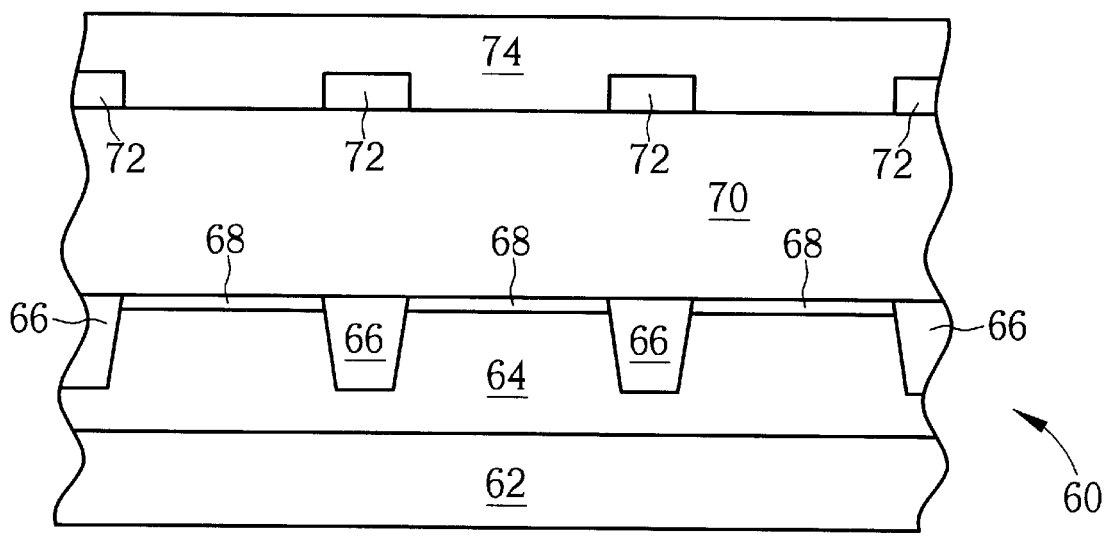
Figure 9:
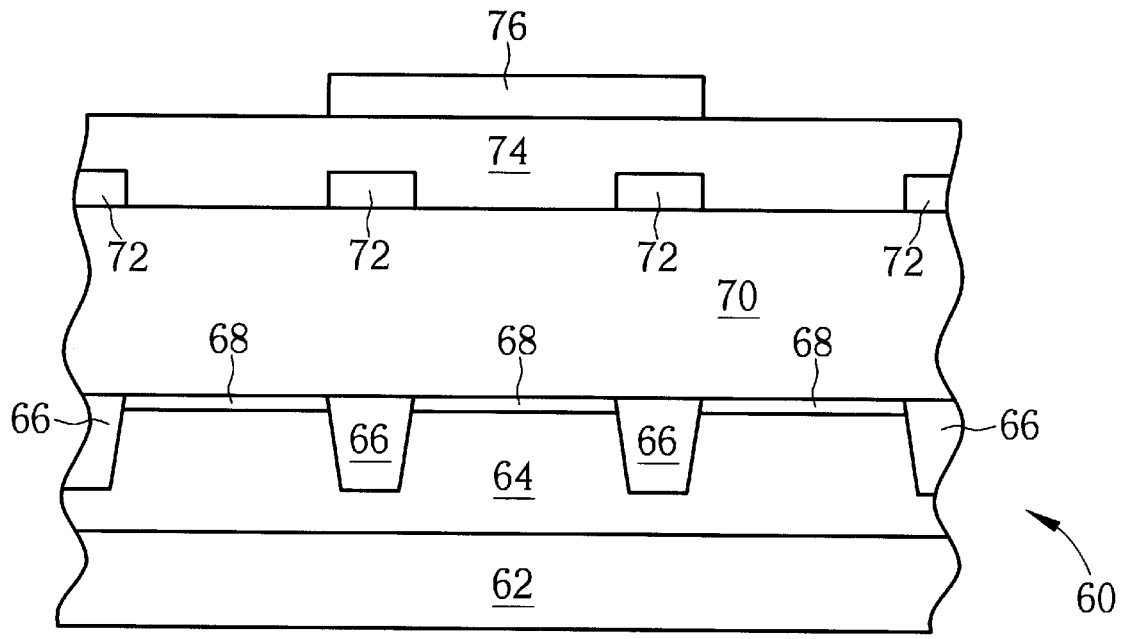

Next, as shown in FIG. 8, a plurality of metal layers 72 are formed on the dielectric layer 70. Each two metal layers 72 are positioned approximately above two ends of one photosensor area 68 that is electrically connected with a MOS transistor sensor. Then, a passivation layer 74 composed of silicon-oxy-nitride is formed on the dielectric layer 70 and metal layers 72. Thereafter, each color filter is sequentially formed on the passivation layer 74 using a prior art method. Firstly, as shown in FIG. 9, a red color filter 76 is formed on the passivation layer 74 and positioned above the photosensor area 68 that is electrically connected with a MOS transistor sensor. The two ends of the red color filter 76 are aligned approximately above the two metal layers 72.

Figure 10:
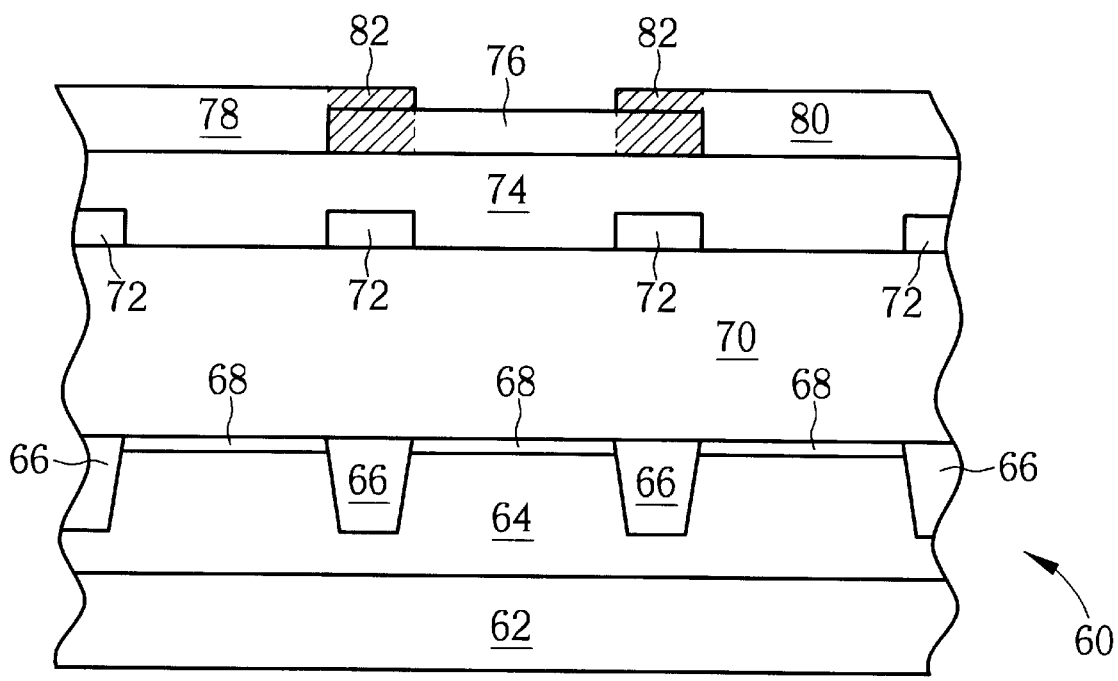

Next, as shown in FIG. 10, a green color filter 78 and a blue color filter 80 are sequentially formed on the passivation layer 74, and portions of both the green color filter 78 and the blue color filter 80 cover one end of the red color filter 76. The width of the covered portion is about 1 $\mu$m. The portion of the green color filter 78 covering the red color filter 76 and the portion of the blue color filter 80 covering the red color filter 76 are both used to increase contact areas of the color filters 76, 78, 80 so as to enhance adhesion of the color filters 76, 78, 80. Simultaneously, the portion of the green color filter 78 covering the red color filter 76 and the portion of the blue color filter 80 covering the red color filter 76 are both used as barrier layers 82 to prevent cross talk effects.

Figure 11:
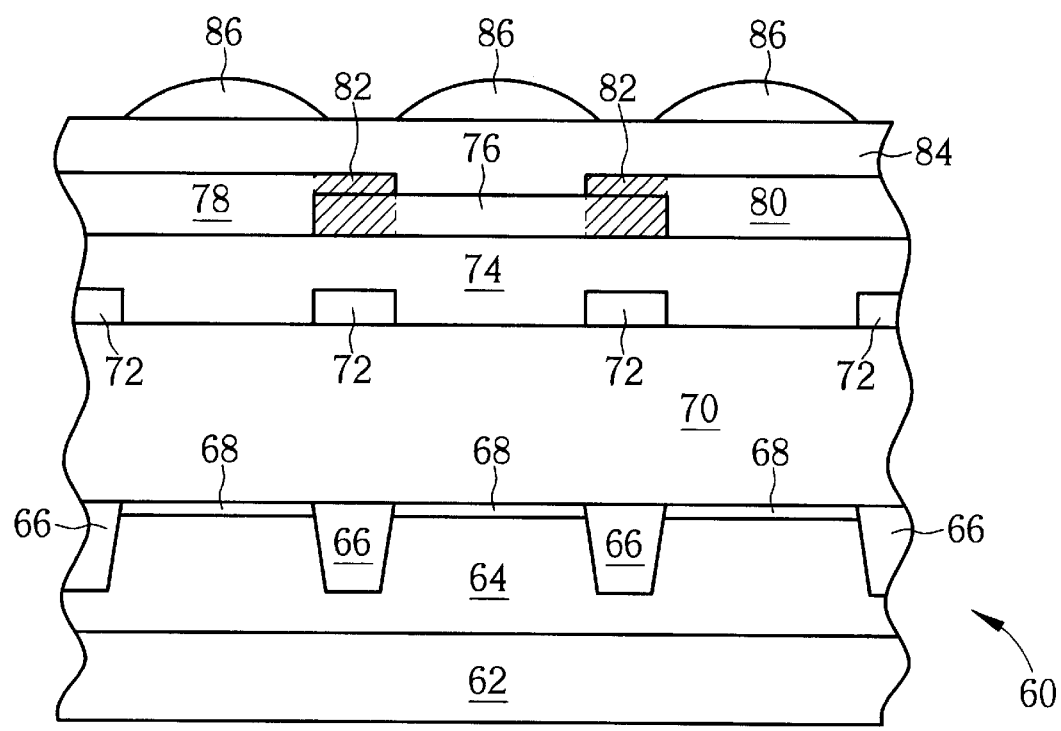

After the formation of each color filter 76, 78, 80, a U-lens is formed using a process of the prior art to accomplish the formation of a photosensor device. As shown in FIG. 11, an interlayer 84 is formed on the surface of the color filters 76, 78, 80, followed by the formation of a polymer layer (not shown) composed of acrylate material on the interlayer 84. Then, an exposure and development process is used to form patterns of U-lenses in the polymer layer. Finally, U-lenses 86 corresponding to each photosensor area 68 are formed by annealing the lens patterns.

The present invention method of manufacturing a color filter array first involves forming each CMOS transistor sensor on the surface of a semiconductor wafer. Then, a dielectric layer, a plurality of metal layers and a passivation layer are sequentially formed. Next, each color filter is sequentially formed on the passivation layer, and portions of the color filters cover one another so as to increase contact areas and enhance the adhesion of the color filters. Simultaneously, the covered portions of each color filter are used as barrier layers to prevent cross talk effects.

In contrast to the color filter array produced by the prior art method, the color filter array produced by the present invention has the following advantages: (1) portions of two color filters cover the third color filter to increase the contact areas and enhance adhesion and prevent stripping of the color filters. (2) the covered portions between the different color filters form a barrier layer so as to prevent incident light from penetrating through the space between each color filter and reduce the noise received by sensors.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of increasing both adhesion of color filters and preventing cross talk effects on a semiconductor wafer, the semiconductor wafer comprising a substrate, a plurality of metal-oxide semiconductor (MOS) transistor sensors positioned on the substrate, and a plurality of insulators positioned on the substrate, and each insulator positioned between each two MOS transistor sensors, the method comprising:

forming a dielectric layer on the semiconductor wafer and covering both the MOS transistor sensors and the insulators;

forming a plurality of metal layers on the dielectric layer, each two metal layers being positioned approximately above two sides of one of the MOS transistor sensors;

forming a passivation layer on the dielectric layer and on the metal layers;

forming a first color filter on the passivation layer, wherein the first color filter is positioned above one of the MOS transistor sensors, and two sides of the first color filter are aligned approximately above the two metal layers; and forming a second color filter and a third color filter on the passivation layer, and portions of both the second color filter and the third color filter covering one side of the first color filter, respectively;

wherein the portion of the second color filter covering the first color filter and the portion of the third color filter covering the first color filter are both used to increase contact areas of the color filters so as to enhance adhesion of the color filters, and simultaneously, the portion of the second color filter covering the first color filter and the portion of the third color filter covering the first color filter are both used as barriers to prevent cross talk effects.

2. The method of claim 1 wherein the color filter is installed in an optic sensor apparatus.

3. The method of claim 1 wherein the MOS transistor sensors are complementary metal-oxide semiconductor (CMOS) transistor sensors.

4. The method of claim 1 wherein the insulators are field oxides (FOX) or shallow trench isolations (STI).

5. The method of claim 1 wherein the dielectric layer is composed of both a silicon-rich oxide (SRO) layer and a spin-on glass (SOG) layer.

6. The method of claim 1 wherein the passivation layer is formed of silicon-oxy-nitride.

7. The method of claim 1 wherein the method further comprises a process for forming a U-lens following the process for forming the color filter.

* * * * *